(12) United States Patent
Kim et al.

(10) Patent No.: US 9,093,460 B2
(45) Date of Patent: Jul. 28, 2015

(54) SEMICONDUCTOR DEVICES

(71) Applicant: Samsung Electronics Co., Ltd., Suwon-si, Gyeonggi-do (KR)

(72) Inventors: Beomseok Kim, Hwasung-si (KR); Ohseong Kwon, Hwasung-si (KR); Wandon Kim, Hwasung-si (KR); Jaewan Chang, Hwasung-si (KR); Kyuho Cho, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/022,865

(22) Filed: Sep. 10, 2013

(65) Prior Publication Data
US 2014/0103491 A1  Apr. 17, 2014

(30) Foreign Application Priority Data

Oct. 16, 2012 (KR) .................. 10-2012-0114870

(51) Int. Cl.
*H01L 49/02* (2006.01)
*H01L 27/108* (2006.01)

(52) U.S. Cl.
CPC .......... *H01L 28/60* (2013.01); *H01L 27/10852* (2013.01); *H01L 27/10894* (2013.01); *H01L 28/75* (2013.01); *H01L 28/91* (2013.01)

(58) Field of Classification Search
CPC ............. H01L 27/12; H01L 27/1203; H01L 21/76254; H01L 21/2011; H01L 21/76264
USPC ................................. 257/532, 352
See application file for complete search history.

(56) References Cited

U.S. PATENT DOCUMENTS

| | | | |
|---|---|---|---|
| 6,623,985 B1 * | 9/2003 | Igarashi | ............................ 438/3 |
| 7,135,732 B2 | 11/2006 | Iwasaki et al. | |
| 7,605,007 B2 | 10/2009 | Wang | |
| 8,035,193 B2 | 10/2011 | Do et al. | |
| 2008/0157157 A1 | 7/2008 | Tonomura et al. | |
| 2009/0026514 A1 | 1/2009 | Wang | |
| 2010/0196592 A1 | 8/2010 | Kim et al. | |
| 2010/0301436 A1 * | 12/2010 | Sashida | ........................ 257/421 |

FOREIGN PATENT DOCUMENTS

| | | |
|---|---|---|
| JP | 2000-022109 | 1/2000 |
| JP | 2000-183312 | 6/2000 |
| JP | 2002-299578 | 10/2002 |
| KR | 20000048131 A | 7/2000 |
| KR | 1020010058494 A | 7/2001 |
| KR | 1020030000963 A | 1/2003 |
| KR | 1020080007382 A | 1/2008 |
| KR | 1020080095277 A | 10/2008 |
| KR | 1020100089522 A | 8/2010 |

* cited by examiner

*Primary Examiner* — Matthew W Such
*Assistant Examiner* — Monica D Harrison
(74) *Attorney, Agent, or Firm* — Myers Bigel Sibley & Sajovec, P.A.

(57) ABSTRACT

The present inventive concept provides semiconductor devices that may include a capacitor including a lower electrode, a dielectric layer, and an upper electrode which are sequentially stacked. An electrode-protecting layer may be provided on the capacitor. The upper electrode may include a conductive metal oxide and the electrode-protecting layer may include a sacrificial reaction layer including a metal-hydrogen compound.

17 Claims, 8 Drawing Sheets

CR

SEMICONDUCTOR DEVICES

CROSS-REFERENCE TO RELATED APPLICATIONS

This U.S. non-provisional patent application claims priority under 35 U.S.C. §119 to Korean Patent Application No. 10-2012-0114870, filed on Oct. 16, 2012, the entirety of which is incorporated by reference herein.

FIELD OF THE INVENTION

The inventive concept relates to semiconductor devices and, more particularly, to semiconductor devices capable of preventing a conductive metal oxide electrode from being reduced by hydrogen.

BACKGROUND

Semiconductor devices are widely used in various electronic industries as semiconductor devices have become smaller, multi-functional, and/or less expensive to manufacture. Semiconductor devices may include: 1) memory devices storing logic data, 2) logic devices processing operations of logic data, and 3) hybrid devices performing various functions.

Highly integrated semiconductor devices as well as high speed semiconductor devices are increasingly in demand in the electronic industry. Various problems, for example, a margin decrease of an exposure process defining fine patterns may be caused, in the semiconductor manufacturing process such that may be difficult to utilize the semiconductor devices.

SUMMARY OF THE INVENTION

Embodiments of the inventive concept provide semiconductor devices capable of preventing a conductive metal oxide electrode from being reduced by hydrogen.

In one embodiment, a semiconductor device may include: a capacitor including a lower electrode, a dielectric layer, and an upper electrode that are sequentially stacked; and an electrode-protecting layer on the capacitor. The upper electrode may include a conductive metal oxide; and the electrode-protecting layer may include a sacrificial reaction layer including a metal-hydrogen compound.

In another embodiment, the metal-hydrogen compound may include a titanium-hydrogen (Ti—H) compound, a tantalum-hydrogen (Ta—H) compound, a niobium-hydrogen (Nb—H) compound, a titanium-tantalum-hydrogen (Ti—Ta—H) compound, a titanium-niobium-hydrogen (Ti—Nb—H) compound, or a tantalum-niobium-hydrogen (Ta—Nb—H) compound.

In another embodiment, a the concentration of hydrogen atoms in the sacrificial reaction layer may have a range of about 0.1 at. % to about 67 at. %.

In another embodiment, the sacrificial reaction layer may have a thickness range of about 50 Å to about 1000 Å.

In another embodiment, the conductive metal oxide may include at least one of $RuO_2$, $IrO_2$, $PtO_2$, or $SrRuO_3$.

In still another embodiment, the electrode-protecting layer may further include: a buffer layer disposed between the upper electrode and the sacrificial reaction layer.

In another embodiment, the electrode-protecting layer may further include: an etch stop layer on the sacrificial reaction layer. In this case, the semiconductor device may further include: a contact plug connected to the etch stop layer. The contact plug may not penetrate a bottom surface of the etch stop layer.

In another embodiment, the electrode-protecting layer may further include: an etch stop layer on the sacrificial reaction layer; and an oxidation preventing layer disposed between the upper electrode and the etch stop layer.

In one embodiment, the oxidation preventing layer includes a nitride that may include at least one of TiN, TiSiN, TaN, or TaSiN.

In another embodiment, the oxidation preventing layer may include first and second oxidation preventing layers; and the sacrificial reaction layer may be provided between the first and second oxidation preventing layers.

In an embodiment, the oxidation preventing layer and the sacrificial reaction layer may be alternately and repeatedly stacked between the upper electrode and the etch stop layer.

In another embodiment, the electrode-protecting layer may cover a sidewall of the upper electrode.

In another aspect, a semiconductor device may include: a conductive metal oxide layer on a substrate; and a sacrificial reaction layer on the conductive metal oxide layer. The sacrificial reaction layer may include titanium (Ti), tantalum (Ta), niobium (Nb), or any alloy thereof; and the thickness of the sacrificial reaction layer may have a range of about 50 Å to about 1000 Å.

In an embodiment, the concentration of hydrogen atoms in the sacrificial reaction layer may have a range of about 0.1 at. % to about 67 at. %.

In an embodiment, the semiconductor device may further include: a buffer layer disposed between the conductive metal oxide layer and the sacrificial reaction layer; and an etch stop layer on the sacrificial reaction layer.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
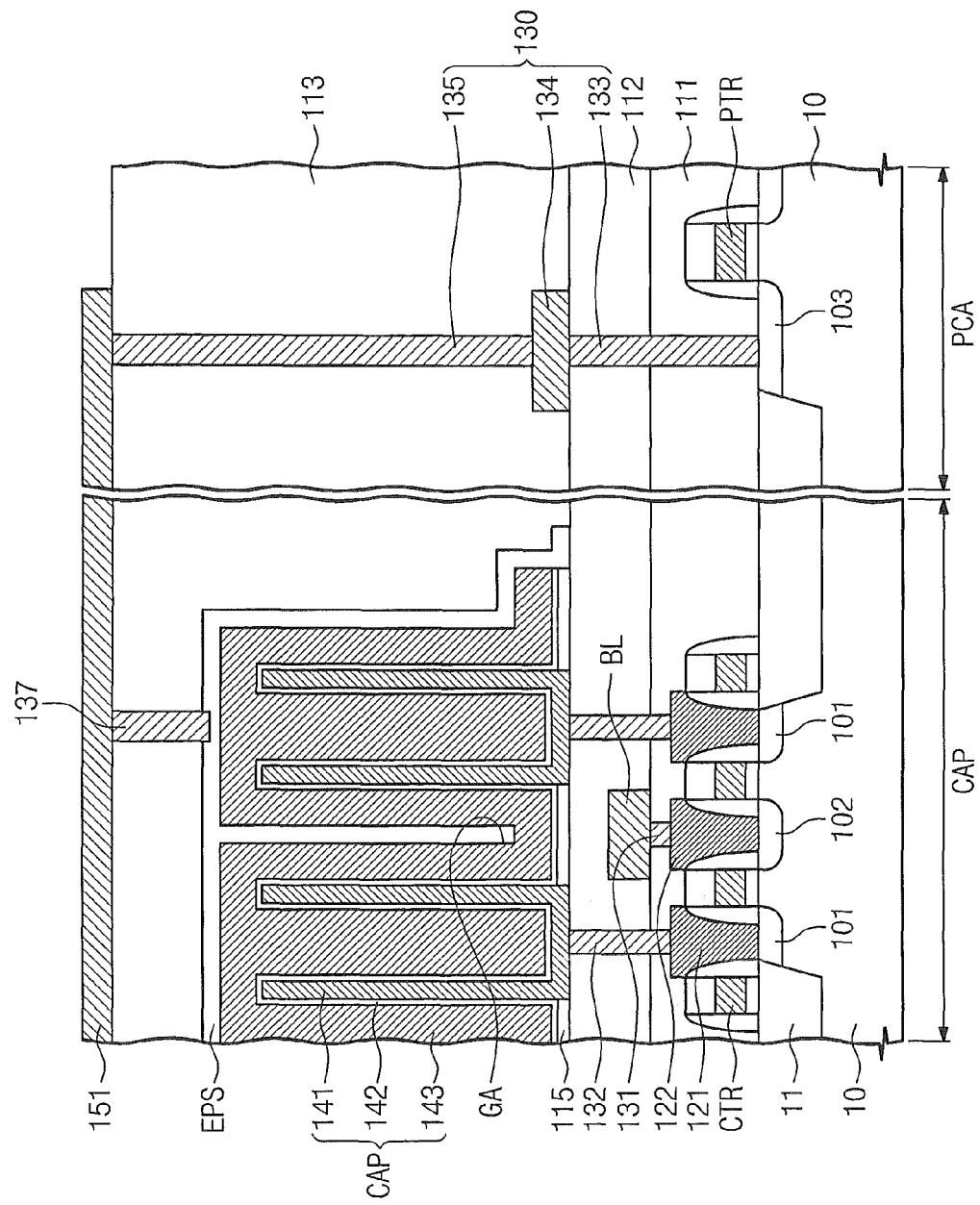
FIG. 1 is a cross-sectional view illustrating a semiconductor device according to example embodiments of inventive concept.

The present invention inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the present invention inventive concept and let those skilled in the art know the category of the present invention inventive concept. In the drawings, embodiments of the present invention inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments of the inventive concept will be described in more detail with reference to the drawings. In the embodiments of the inventive concept, a dynamic random access memory (DRAM) device will be described as an example for the purpose of simplicity, ease and convenience in explanation. However, the present invention inventive concept is not limited thereto. The embodiments of the inventive concept may also be applied to other memory devices or other semiconductor devices.

FIG. 1 is a cross-sectional view illustrating a semiconductor device according to example embodiments of the inventive concept. A substrate 10 may be provided. The substrate 10 may include a cell array region CAR and a peripheral circuit region PCA. In one embodiment, the substrate 10 may be a semiconductor substrate including, but not limited to, silicon, germanium, or silicon-germanium. The substrate 10 may include active regions defined by a device isolation layer 11. The cell array region CAR may be a region including a plurality of memory cells. For example, the memory cells may be DRAM cells. The peripheral circuit region PCA may be a region including circuits for driving the memory cells of the cell array region CAR.

A plurality of cell transistors CTR may be provided in the cell array region CAR. The cell transistors CTR may include first dopant regions 101 and a second dopant region 102. In one embodiment, the dopant regions 101 and 102 may be doped with dopants of a conductivity type different from a conductivity type of the substrate 10. In another embodiment, the second dopant region 102 may be provided between the first dopant regions 101.

Storage node contact pads 121 and a bit line contact pad 122 may be provided between the cell transistors CTR. The storage node contact pads 121 may be connected to the first dopant regions 101, respectively. The bit line contact pad 122 may be connected to the second dopant region 102. The contact pads 121 and 122 may be formed to be self-aligned with sidewalls of the cell transistors CTR. The contact pads 121 and 122 may be formed of silicon, a metal, and/or a conductive metal nitride.

A first interlayer insulating layer 111 and a second interlayer insulating layer 112 may be sequentially disposed on the cell transistors CTR. For example, the interlayer insulating layers 111 and 112 may include silicon oxide, silicon nitride, and/or silicon oxynitride. A bit line BL may be disposed between the first interlayer insulating layer 111 and the second interlayer insulating layer 112. The bit line BL may be electrically connected to the second dopant region 102 through a first contact plug 131 and the bit line contact pad 122. The first contact plug 131 penetrates the first interlayer insulating layer 111.

A capacitor CAP may be provided on the second interlayer insulating layer 112. The capacitor CAP may include lower electrodes 141, a dielectric layer 142, and an upper electrode 143. In an embodiment, each of the lower electrodes 141 may have a cylindrical shape of which a bottom is closed. The lower electrodes 141 may be electrically connected to the first dopant regions 101 through second contact plugs 132 and the storage node contact pads 121, respectively. The second contact plugs 132 may penetrate the interlayer insulating layers 111 and 112. An etch stop layer 115 for formation of holes (not shown) in which the lower electrodes 141 are formed may be provided between the lower electrodes 141. The etch stop layer 115 may include silicon nitride.

The dielectric layer 142 may be substantially conformally formed along the shapes of the lower electrodes 141. The dielectric layer 142 may include a high-k metal oxide layer. For example, the dielectric layer 142 may include a titanium oxide layer. The upper electrode 143 may be substantially conformally formed along the shapes of the lower electrodes 151 covered by the dielectric layer 142. In an embodiment, a gap region GA may be defined between the lower electrodes 141 and the sidewall of the upper electrode 143. In another embodiment, the upper electrode 143 may completely fill a space between the lower electrodes 141.

The upper electrode 143 and the lower electrodes 141 may include a conductive metal oxide. The conductive metal oxide may include at least one of $RuO_2$, $IrO_2$, $PtO_2$, or $SrRuO_3$. The conductive metal oxide may be formed by an atomic layer deposition (ALD) process or a chemical vapor deposition (CVD) process.

An electrode-protecting layer EPS may be provided on the upper electrode 143. The electrode-protecting layer EPS may cover a top surface and the sidewall of the upper electrode 143. In an embodiment, at least a portion of layers consisting of the electrode-protecting layer EPS may fill the gap region GA. The electrode-protecting layer EPS will be described in more detail with reference to FIGS. 2 to 5.

A third interlayer insulating layer 113 may be disposed on the electrode-protecting layer EPS, and a conductive line 151 may be disposed on the third interlayer insulating layer 113. The conductive line 151 may be connected to the electrode-protecting layer EPS through a cell contact plug 137 penetrating the third interlayer insulating layer 113. One cell contact plug 137 is illustrated in FIG. 1 for the purpose of, simplicity, ease and convenience in explanation. However, the inventive concept is not limited thereto. In another embodiment, a plurality of the cell contact plugs may be connected to the electrode-protecting layer EPS.

The third interlayer insulating layer 113 may include silicon oxide, silicon nitride, and/or silicon oxynitride. The conductive line 151 and the cell contact plug 137 may be formed of a metal, a doped semiconductor, and/or a conductive metal nitride. In one embodiment, the conductive line 151 and the cell contact plug 137 may be formed using a sputtering process or a metal organic chemical vapor deposition (MOCVD) process.

The peripheral circuit region PCA may include a peripheral transistor PTR. The peripheral transistor PTR may include a third dopant region 103 formed in the substrate 10 of the peripheral circuit region PCA. The third dopant region 103 of the peripheral transistor PTR may be electrically connected to the conductive line 151 through a peripheral contact plug 130. The peripheral contact plug 130 may include a lower contact plug 133 and an upper contact plug 135. The lower contact plug 133 may penetrate the first and second interlayer insulating layers 111 and 112 and may be connected to the third dopant region 103. The upper contact plug 135 may penetrate the third interlayer insulating layer 113 and may be connected to the conductive line 151. In one embodiment, the lower contact plug 133 may be formed along with the first contact plug 131 or the second contact plug 132. The upper contact plug 135 may be formed along with the cell contact plug 137. The peripheral contact plug 130 may further include a landing pad 134 disposed between the upper contact plug 135 and the lower contact plug 133. The peripheral contact plug 130 may be formed of a metal, a doped semiconductor, and/or a conductive metal nitride. In an embodiment, the peripheral contact plug 130 may be formed using a sputtering process or a MOCVD process.

FIGS. 2 to 5 are cross-sectional views illustrating electrode-protecting layers according to example embodiments of the present invention inventive concept.

Figure 2:
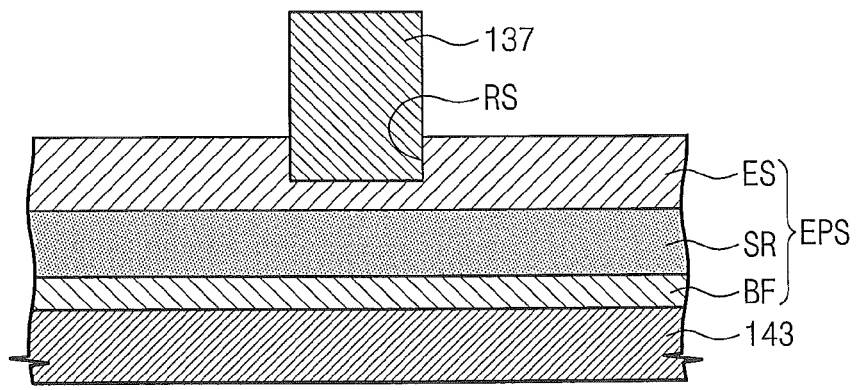
FIGS. 2 to 5 are cross-sectional views illustrating electrode-protecting layers according to example embodiments of the inventive concept.

FIG. 2 is a cross-sectional view illustrating an electrode-protecting layer EPS according to some embodiments of the present invention inventive concept. The electrode-protecting layer EPS may include a buffer layer BF, a sacrificial reaction layer SR, and an etch stop layer ES which are sequentially stacked on the upper electrode 143. The sacrificial reaction layer SR may include a material having reactivity with hydrogen that is greater than that of the upper electrode 143. For example, the sacrificial reaction layer SR may include titanium (Ti), tantalum (Ta), niobium (Nb), or any alloy thereof. The sacrificial reaction layer SR may be formed by a deposition process such as a MOCVD process or a sputtering process. The sacrificial reaction layer SR may react with hydrogen occurring in a forming process of a semiconductor device to form a metal-hydrogen compound. As a result, the upper electrode 143 may be prevented from being reduced (or deoxidized) by hydrogen. In other words, the sacrificial reaction layer SR may include a titanium-hydrogen (Ti—H) compound, a tantalum-hydrogen (Ta—H) compound, a niobium-hydrogen (Nb—H) compound, a titanium-tantalum-hydrogen (Ti—Ta—H) compound, a titanium-niobium-hydrogen (Ti—Nb—H) compound, or a tantalum-niobium-hydrogen (Ta—Nb—H) compound. In one embodiment, the concentration of hydrogen atoms in the sacrificial reaction layer SR may have a range of about 0.1 at. % to about 67 at. %.

The electrode-protecting layer EPS may include the buffer layer BF disposed between the sacrificial reaction layer SR and the upper electrode 143. The buffer layer BF may prevent an interface reaction between the upper electrode 143 and the sacrificial reaction layer SR. The buffer layer BF may include at least one of ruthenium (Ru), iridium (Ir), platinum (Pt), or strontium-ruthenium (SrRu). The thickness of the buffer layer BF may be equal to or less than about 500 Å. The electrode-protecting layer EPS may include the etch stop layer ES disposed on the sacrificial reaction layer SR. The etch stop layer ES may include conductive material. For example, the etch stop layer ES may include tungsten (W) or ruthenium (Ru). The etch stop layer ES may include a contact hole RS in which the cell contact plug 137 is provided. The cell contact plug 137 may not penetrate a bottom surface of the etch stop layer ES. In other words, a bottom surface and a sidewall of the contact hole RS may be defined by the etch stop layer ES.

Figure 7A:
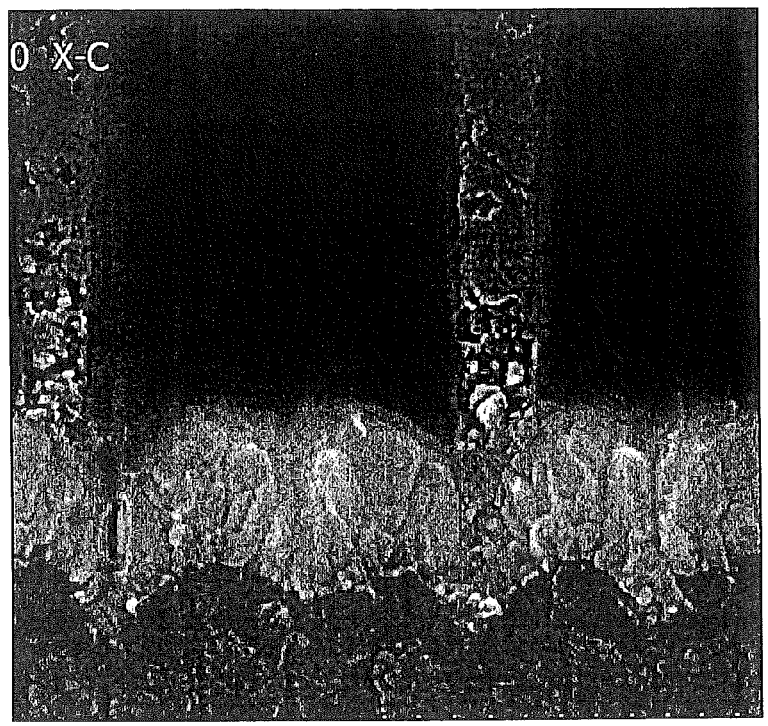
FIGS. 7A, 7B, and 7C are scanning electron microscope (SEM) photographs according to embodiments of the inventive concept and comparison examples.
Figure 7B:
Figure 7C:
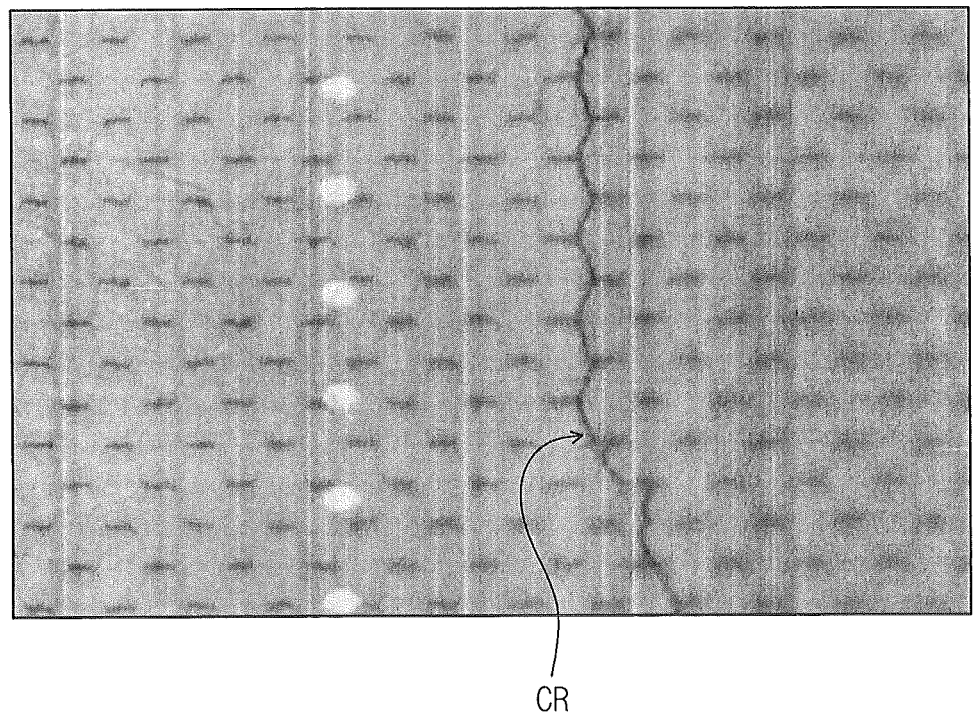

FIGS. 7A, 7B, and 7C are scanning electron microscope (SEM) photographs according to embodiments of the inventive concept along with comparison examples.

The sacrificial reaction layer may have a thickness that ranges from about 50 Å to about 1000 Å. If the thickness of the sacrificial reaction layer is less than about 50 Å, the electrode may be incompletely prevented from being reduced, such that an upper portion of the electrode may be reduced as illustrated in FIG. 7B. In FIG. 7B, a reduction region RD occurs in the upper portion of the electrode. If the thickness of the sacrificial reaction layer is greater than about 1000 Å, a great stress may be applied to the upper portion of the electrode. Thus, a crack CR may occur in the upper portion of the electrode as illustrated in FIG. 7C, or the electrode may lift from an underlying layer. Alternatively, if the thickness of the sacrificial reaction layer is within the range of about 50 Å to about 1000 Å, the electrode may be formed without the reduction region RD and/or the crack CR as illustrated in FIG. 7A.

Figure 6A:
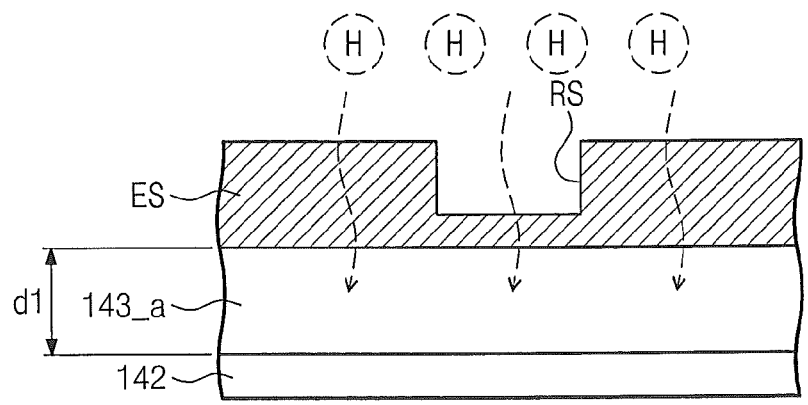
FIGS. 6A and 6B are cross-sectional views illustrating an example for comparison with other embodiments of the inventive concept.
Figure 6B:
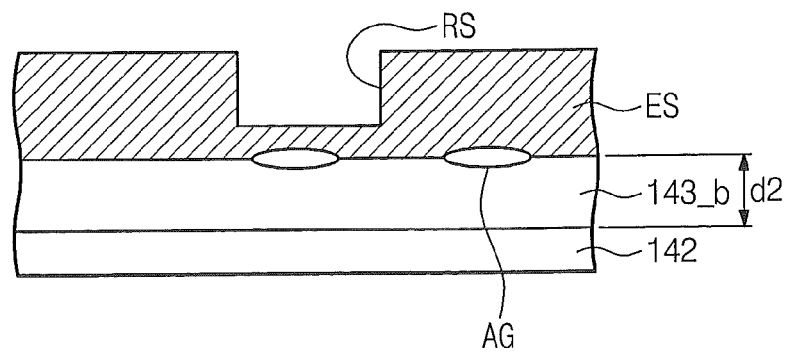

FIGS. 6A and 6B are cross-sectional views illustrating a comparison example for other embodiments of the inventive concept. FIG. 6A illustrates a permeating process of hydrogen into an upper electrode 143a. FIG. 6B illustrates an upper electrode 143b after the permeation of hydrogen. The forming process of the semiconductor device may include a process performed under a reduction atmosphere. In one embodiment, the process of forming the contact hole RS may be performed under an atmosphere including hydrogen. In one embodiment, the process of forming the contact hole RS may include a cleaning process that is performed using a plasma source gas including hydrogen ions. The hydrogen ions may permeate into the upper electrode 143a through the contact hole RS and/or may permeate into the upper electrode 143a through another portion of the etch stop layer ES except the contact hole RS (see, FIG. 6A).

The hydrogen ions that permeated into the upper electrode 143a may reduce (or deoxidize) the conductive metal oxide constituting the upper electrode 143a, such that electrical characteristics of a semiconductor device may be deteriorated. The conductive metal oxide may have a work function greater than that of a metal but may have an inter-atomic bonding force weaker than that of the metal. Thus, the conductive metal oxide may be easily reduced by hydrogen. $RuO_2$ used as an example of the conductive metal oxide may react with hydrogen, so as to be reduced to ruthenium (Ru). The reduced conductive metal oxide may have a work function lower than that of the conductive metal oxide. As a result, a leakage current of the capacitor CAP may increase. For example, the work function of $RuO_2$ is about 5.1 eV and the work function of ruthenium (Ru) is about 4.7 eV. The leakage current of the capacitor CAP may increase by the low work function of the reduced conductive metal oxide (e.g., ruthenium (Ru)).

The upper electrode 143b reduced by hydrogen has a density greater than that of the upper electrode 143a before the reduction. For example, the density of $RuO_2$ is about 9.1 g/cm$^3$ and the density of ruthenium (Ru) is about 12.45 g/cm$^3$. Due to this density difference, a thickness d2 of the reduced upper electrode 143b may be smaller than a thickness d1 of the upper electrode 143a before the reduction. Additionally, the etch stop layer ES may be separated from the upper electrode 143b, such that a gap GA or a bubble may be generated between the etch stop layer ES and the upper electrode 143b. Thus, a structure of the capacitor CAP may be modified or a resistance of a semiconductor device may increase. The process causing the hydrogen permeation is not limited to the process of forming the contact hole RS. For example, at least one of the interlayer insulating layers 111, 112, and 113 of FIG. 1 may include hydrogen. The hydrogen in the interlayer insulating layers 111, 112, and 113 may be diffused into the upper electrode 143 and/or the lower electrodes 141.

According to some embodiments of the inventive concept, the electrode-protection structure including the sacrificial reaction layer SR may be formed on the upper electrode 143, such that it is possible to prevent electrical characteristic deterioration and structural modification of the semiconductor device which are caused by the hydrogen permeation.

Figure 3:
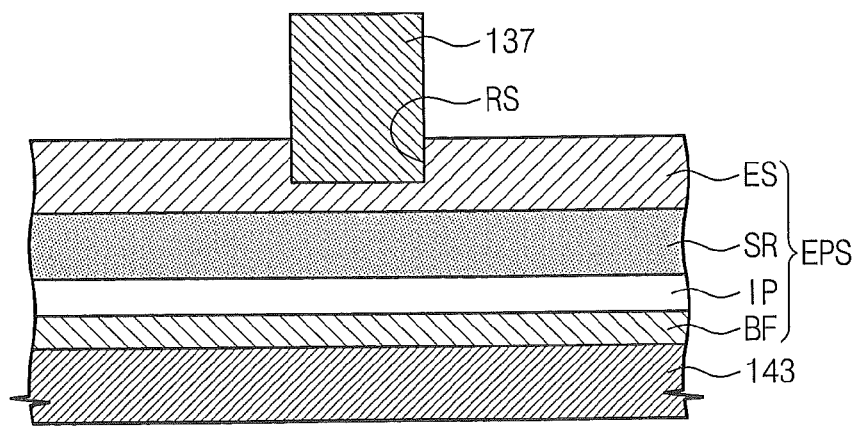

FIG. 3 is a cross-sectional view illustrating an electrode-protecting layer EPS according to other embodiments of the inventive concept. For the purpose of simplicity, ease and convenience in explanation, the descriptions to the same elements as in the above embodiments may be omitted or mentioned briefly. The electrode-protecting layer EPS according to the present embodiment may include an oxidation preventing layer IP disposed between the sacrificial reaction layer SR and the buffer layer BF. The oxidation preventing layer IP may prevent the buffer layer BF from being oxidized. For example, the oxidation preventing layer IP may include at least one of TiN, TiSiN, TaN, or TaSiN. The thickness of the oxidation preventing layer IP may have a range of about 5% to about 400% of a the thickness of the sacrificial reaction layer SR.

Figure 4:
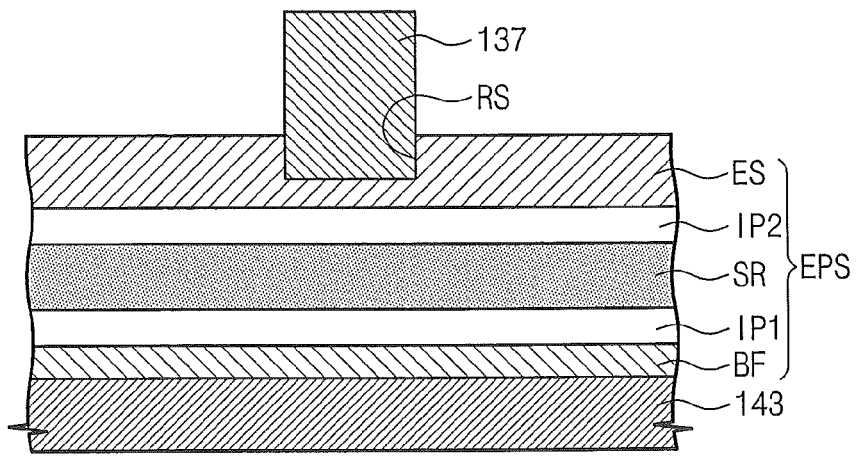

FIG. 4 is a cross-sectional view illustrating an electrode-protecting layer EPS according to still other embodiments of the inventive concept. For the purpose of simplicity, ease and convenience in explanation, the descriptions to the same elements as in the above embodiments may be omitted or mentioned briefly. The electrode-protecting layer EPS according to the present embodiment may include a plurality of oxidation preventing layers. In one embodiment, a first oxidation preventing layer IP1 may be formed between the buffer layer BF and the sacrificial reaction layer SR, and a second oxidation preventing layer IP2 may be formed between the sacrificial reaction layer SR and the etch stop layer ES. The first oxidation preventing layer IP1 may prevent the buffer layer BF from being oxidized, and the second oxidation preventing layer IP2 may prevent the sacrificial reaction layer SR from being oxidized. The oxidation preventing layers IP1 and IP2 may include at least one of TiN, TiSiN, TaN, or TaSiN.

Figure 5:
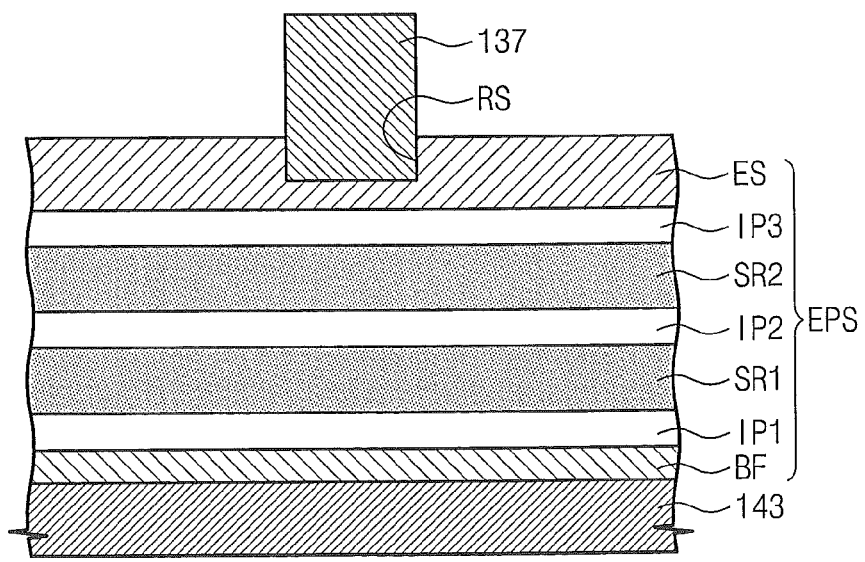

FIG. 5 is a cross-sectional view illustrating an electrode-protecting layer EPS according to yet other embodiments of the inventive concept. For the purpose of simplicity, ease and convenience in explanation, the descriptions to the same elements as in the above embodiments may be omitted or mentioned briefly. The electrode-protecting layer EPS according to the present embodiment may include sacrificial reaction layers and oxidation preventing layers which are alternately stacked. In one embodiment, the electrode-protecting layer EPS may include first and second sacrificial reaction layers SR1 and SR2. First, second, and third oxidation preventing layers IP1, IP2, and IP3 may be disposed between the first sacrificial reaction layer SR1 and the buffer layer BF, between the first sacrificial reaction layer SR1 and the second sacrificial reaction layer SR2, and between the second sacrificial reaction layer SR2 and the etch stop layer ES, respectively.

According to embodiments of the inventive concept, the electrode-protection structure including the sacrificial reaction layer may be formed on the upper electrode, such that it is possible to prevent the electrical characteristic deterioration and the structural modification of the semiconductor device caused by the hydrogen permeation.

Figure 8:
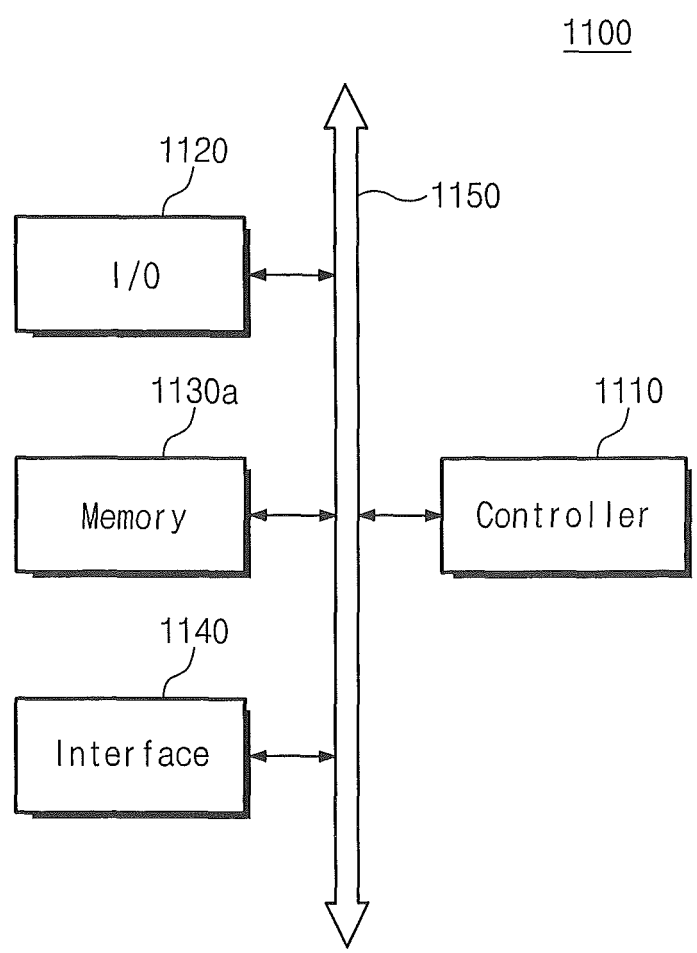
FIG. 8 is a schematic block diagram illustrating an example of electronic systems including semiconductor devices according to example embodiments of the inventive concept.

FIG. 8 is a schematic block diagram illustrating an example of electronic systems including semiconductor devices according to example embodiments of the inventive concept.

Referring to FIG. 8, an electronic system 1100 according to embodiments of the inventive concept may include a controller 1110, an input/output (I/O) unit 1120, a memory device 1130a, an interface unit 1140 and a data bus 1150. At least two of the controller 1110, the I/O unit 1120, the memory device 1130a and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130a may store data and/or commands. The memory device 1130a may include at least one of the semiconductor devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast Static Random Access Memory (SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 9:
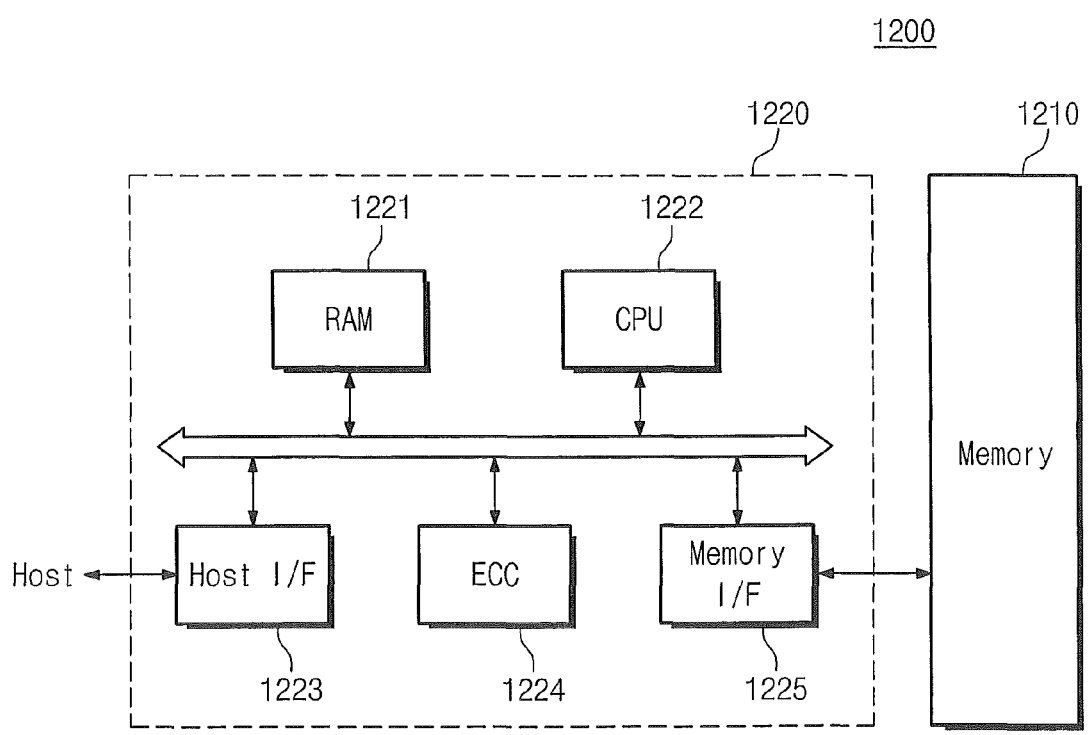
FIG. 9 is a schematic block diagram illustrating an example of memory cards including semiconductor devices according to example embodiments of the inventive concept.

FIG. 9 is a schematic block diagram illustrating an example of memory cards including semiconductor devices according to example embodiments of the inventive concept.

Referring to FIG. 9, a memory card 1200 according to embodiments of the inventive concept may include a memory device 1210. The memory device 1210 may include at least one of the semiconductor devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include a SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be utilized as solid state disks (SSD) which are used as hard disks of computer systems.

According to embodiments of the inventive concept, the reduction of the electrode caused by hydrogen may be prevented by the electrode-protecting layer including the sacrificial reaction layer. The electrode-protecting layer may prevent the leakage current of the semiconductor device from increasing. In addition, the electrode-protecting layer may prevent the structural modification of the semiconductor device.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
    a capacitor including a lower electrode, a dielectric layer, and an upper electrode that are sequentially stacked; and
    an electrode-protecting layer on the capacitor,
    wherein the upper electrode includes a conductive metal oxide; and
    wherein the electrode-protecting layer includes a sacrificial reaction layer including a metal-hydrogen compound and a concentration of hydrogen atoms in the sacrificial reaction layer is in a range of about 0.1 at. % to about 67 at. %.

2. The semiconductor device of claim 1, wherein the metal-hydrogen compound includes a titanium-hydrogen (Ti—H) compound, a tantalum-hydrogen (Ta—H) compound, a niobium-hydrogen (Nb—H) compound, a titanium-tantalum-hydrogen (Ti—Ta—H) compound, a titanium-niobium-hydrogen (Ti—Nb—H) compound, or a tantalum-niobium-hydrogen (Ta—Nb—H) compound.

3. The semiconductor device of claim 1, wherein a thickness of the sacrificial reaction layer is in a range of about 50 Å to about 1000 Å.

4. The semiconductor device of claim 1, wherein the conductive metal oxide includes at least one of $RuO_2$, $IrO_2$, $PtO_2$, or $SrRuO_3$.

5. The semiconductor device of claim 1, wherein the electrode-protecting layer further comprises a buffer layer disposed between the upper electrode and the sacrificial reaction layer.

6. The semiconductor device of claim 1, wherein the electrode-protecting layer further comprises an etch stop layer disposed on the sacrificial reaction layer, the semiconductor device, further comprising a contact plug connected to the etch stop layer, wherein the contact plug does not penetrate a bottom surface of the etch stop layer.

7. The semiconductor device of claim 1, wherein the electrode-protecting layer further comprises:
    an etch stop layer disposed on the sacrificial reaction layer; and
    an oxidation preventing layer disposed between the upper electrode and the etch stop layer.

8. The semiconductor device of claim 7, wherein the oxidation preventing layer includes at least one of TiN, TiSiN, TaN, or TaSiN.

9. The semiconductor device of claim 7, wherein the oxidation preventing layer includes a first oxidation preventing layer and a second oxidation preventing layer; and
    wherein the sacrificial reaction layer is provided between the first oxidation preventing layer and the second oxidation preventing layer.

10. The semiconductor device of claim 7, wherein the oxidation preventing layer and the sacrificial reaction layer are alternately and repeatedly stacked between the upper electrode and the etch stop layer.

11. The semiconductor device of claim 1, wherein the electrode-protecting layer covers a sidewall of the upper electrode.

12. A semiconductor device comprising:
    a conductive metal oxide layer on a substrate; and
    a sacrificial reaction layer on the conductive metal oxide layer,
    wherein the sacrificial reaction layer includes a titanium (Ti), tantalum (Ta), niobium (Nb), or any alloy thereof; and wherein a thickness of the sacrificial reaction layer is in a range of about 50 Å to about 1000 Å, and a concentration of hydrogen atoms in the sacrificial reaction layer is in a range of about 0.1 at. % to about 67 at. %.

13. The semiconductor device of claim 12, further comprising:
   a buffer layer disposed between the conductive metal oxide layer and the sacrificial reaction layer; and
   an etch stop layer disposed on the sacrificial reaction layer.

14. A capacitor comprising:
   a lower electrode, a dielectric layer, and an upper electrode that are sequentially stacked; and
   an electrode-protecting layer on the upper electrode,
   wherein the upper electrode includes a conductive metal oxide; and
   wherein the electrode-protecting layer includes a sacrificial reaction layer including a metal-hydrogen compound, and wherein the electrode-protecting layer further comprises a buffer layer disposed between the upper electrode and the sacrificial reaction layer.

15. The capacitor of claim 14, wherein the metal-hydrogen compound includes a titanium-hydrogen (Ti—H) compound, a tantalum-hydrogen (Ta—H) compound, a niobium-hydrogen (Nb—H) compound, a titanium-tantalum-hydrogen (Ti—Ta—H) compound, a titanium-niobium-hydrogen (Ti—Nb—H) compound, or a tantalum-niobium-hydrogen (Ta—Nb—H) compound.

16. The capacitor of claim 14, wherein the electrode-protecting layer further comprises:
   an etch stop layer disposed on the sacrificial reaction layer; and
   an oxidation preventing layer disposed between the upper electrode and the etch stop layer.

17. The capacitor of claim 14, wherein a concentration of hydrogen atoms in the sacrificial reaction layer is in a range of about 0.1 at. % to about 67 at. %.

* * * * *